US012575386B2

(12) United States Patent
Reboh et al.

(10) Patent No.: US 12,575,386 B2
(45) Date of Patent: Mar. 10, 2026

(54) METHOD FOR DIRECT HYDROPHILIC BONDING OF SUBSTRATES

(71) Applicant: COMMISSARIAT A L'ENERGIE ATOMIQUE ET AUX ENERGIES ALTERNATIVES, Paris (FR)

(72) Inventors: Shay Reboh, Grenoble Cedex (FR); Vincent Larrey, Grenoble Cedex (FR); Frank Fournel, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 793 days.

(21) Appl. No.: 17/574,786

(22) Filed: Jan. 13, 2022

(65) Prior Publication Data

US 2022/0223467 A1 Jul. 14, 2022

(30) Foreign Application Priority Data

Jan. 14, 2021 (FR) ...................................... 21 00362

(51) Int. Cl.
*H01L 21/762* (2006.01)
*H01L 21/763* (2006.01)
(52) U.S. Cl.
CPC ...... *H01L 21/76251* (2013.01); *H01L 21/763* (2013.01)
(58) Field of Classification Search
CPC ............. H01L 21/76251; H01L 21/763; H01L 21/02002; H01L 21/187; H01L 21/265; H01L 21/268
See application file for complete search history.

(56) References Cited

U.S. PATENT DOCUMENTS

| 6,563,133 B1 | 5/2003 | Tong |
| 2003/0129780 A1 | 7/2003 | Auberton-Herve |

(Continued)

FOREIGN PATENT DOCUMENTS

| JP | H1174209 A | * 3/1999 |
| WO | WO 2021/009459 A1 | 1/2021 |

OTHER PUBLICATIONS

English translation (Year: 1999) JP-H1174209A.*

(Continued)

*Primary Examiner* — Latanya N Crawford Eason
(74) *Attorney, Agent, or Firm* — Oblon, McClelland, Maier & Neustadt, L.L.P.

(57) ABSTRACT

A method for hydrophilic direct bonding of a first substrate onto a second substrate is provided, including: providing the first substrate having a first main surface and the second substrate having a second main surface; bringing the first and the second substrates into contact with one another, respectively, via the first and the second main surfaces, to form a bonding interface between two bonding surfaces; applying a heat treatment to close the bonding interface; and prior to the step of bringing the first and the second substrates into contact, forming, on the first main surface and/or on the second main surface, a bonding layer made of an amorphous semiconductor material having doping elements and a thickness of less than or equal to 50 nm, a face of the bonding layer constituting one of the two bonding surfaces, an oxide layer being less than 20 nm from the bonding interface.

22 Claims, 6 Drawing Sheets

(56) References Cited

U.S. PATENT DOCUMENTS

| | | | |
|---|---|---|---|
| 2003/0141502 | A1 | 7/2003 | Tong |
| 2005/0151155 | A1 | 7/2005 | Auberton-Herve |
| 2006/0264004 | A1 | 11/2006 | Tong et al. |
| 2015/0069523 | A1* | 3/2015 | Or-Bach ........... H01L 29/66621 |
| | | | 257/390 |
| 2017/0025306 | A1* | 1/2017 | Wang .................... H01L 21/185 |
| 2017/0178950 | A1* | 6/2017 | Batude .............. H01L 21/02532 |
| 2017/0179114 | A1* | 6/2017 | Mathieu .............. H01L 27/0688 |

OTHER PUBLICATIONS

French Preliminary Search Report issued Sep. 22, 2021 in French
Application 21 00362 filed on Jan. 14, 2021, 10 pages (with English
Translation of Categories of Cited Documents & Written Opinion).

\* cited by examiner

S2

20

22

12

10

S1

S2

20

22

I

12

10

S1

METHOD FOR DIRECT HYDROPHILIC BONDING OF SUBSTRATES

TECHNICAL FIELD

The invention relates to a method for the hydrophilic direct bonding of substrates for microelectronic, optoelectronic or optical applications. One particularly advantageous application concerns the monolithic 3D integration of microelectronic components.

PRIOR ART

Substrates, in particular semiconductor substrates, are bonded in a known manner to form structures adapted for the manufacture of microelectronic, optoelectronic or optical devices.

For example, structures of the semiconductor-on-insulator type successively comprise a carrier substrate, an electrically insulating layer and a thin semiconductor layer, referred to as the active layer. When the active layer is made of silicon, the structure is referred to as a "silicon on insulator" (or SOI) structure. The electrically insulating layer is typically a silicon oxide layer and is often referred to as a "buried oxide" (or BOX) layer.

One particularly advantageous method for forming such structures is the Smart Cut™ method. This method typically comprises the following steps of:

providing a carrier substrate;

providing a silicon donor substrate, coated with a silicon oxide layer, for example formed by thermal oxidation;

implanting ionic species, such as hydrogen and/or helium, into the donor substrate through the silicon oxide layer, so as to form an embrittlement area delimiting the thin layer to be transferred;

bonding the donor substrate onto the carrier substrate, the silicon oxide layer being located at the bonding interface;

breaking the donor substrate along the embrittlement area and splitting the remnant from the donor substrate so as to transfer the thin layer of silicon onto the donor substrate.

Preferably, bonding is direct bonding, i.e. without an adhesive layer being applied. Such bonding is also referred to as molecular bonding. This bonding is advantageously of the hydrophilic type, i.e. the adhesion between the donor substrate and the carrier substrate is achieved by means of water molecules present at the bonding interface. The water is subsequently removed by heat treatment. Advantageously, this bonding is carried out at ambient pressure.

To ensure high quality bonding, the contacting surfaces of the carrier substrate and of the donor substrate must have a very low surface roughness, typically in the order of 1 to a few nm RMS. Despite this, due to the high stiffness and hardness of the substrates, there will always be some asperities when they are brought into contact with one another.

Asperities on the surface of the substrates create cavities at the interface between the two substrates; the bonding interface is thus not completely closed. However, when heat treatment is applied at a high temperature, the contact area increases, due to atomic mobility at the interface, until the asperities are flattened, thus removing the cavities; the bonding interface is thus closed.

However, such closure of the bonding interface can only be achieved at the cost of a large thermal budget. Thus, to achieve bonding between two layers of thermal oxide, the temperature to be applied is typically 1,200° C. for several hours. To achieve bonding between a thermal oxide layer and a silicon substrate (potentially coated with a native oxide), the temperature to be applied is typically 1,100° C. for 2 hours; this temperature can be reduced to 1,050° C. for 2 hours if a plasma treatment is applied to the oxide layer beforehand.

Such high-temperature heat treatments are typically very expensive. They must be carried out with slow temperature rises so as not to risk deforming the substrates, which results in long treatment times, or under extremely well-controlled heating conditions, which requires complex equipment. Moreover, the semiconductor materials can become damaged at high temperatures.

The temperature of the heat treatment to close the interface should thus be minimised, while ensuring that this interface is closed.

More specifically, an interfacial gap can be extremely damaging to the integrity and performance of the bonded structure.

A first consequence of imperfect interface closure is localised detachment, particularly at the edges of the bonded structure. The areas that have become detached from the edge of the wafers are locally redeposited on the surface of the substrate, creating areas that are unsuitable for the subsequent manufacture of electronic devices. These defects are referred to as "flakes".

A second consequence of imperfect interface closure is that the cavities present at the interface form areas susceptible to preferential attack by a chemical etchant. More specifically, the etchant can enter the interface through these cavities and preferentially etch the materials present at the interface.

The addition of metal layers (for example copper or tungsten layers) to the bonding interface or of polymer deposits can allow low interface-closing temperatures to be implemented, typically temperatures below 500° C. However, metal materials, being electrically conducting or generating impurities in the semiconductor substrates, are incompatible with many microelectronic applications. Moreover, polymers are unstable at circuit manufacturing temperatures.

Structures also exist that are adapted to the formation of devices by monolithic 3D integration of microelectronic components.

Such a structure is, for example, shown in FIG. 4. More particularly, this figure shows a two-level structure for the integration of microelectronic components such as transistors, from which a three-dimensional microelectronic device can be formed. The structure shown comprises:

a bottom substrate S1 constituting a first of the two integration levels, a top substrate (S2) constituting the second of the two integration levels, an electrically conducting layer 15, for example containing a polycrystalline silicon or a metal, located between the bottom substrate S1 and the top substrate S2, and two layers 11 and 21 made of a dielectric material, each electrically insulating the ground plane 15 and one of the bottom or top substrates.

Such a structure can be obtained by a method comprising the following steps of:

Providing a bottom substrate S1 comprising, on one of the main faces thereof, a layer made of a dielectric material 11, Providing a top substrate S2 comprising, on one of the main faces thereof, a layer made of a dielectric material 21, Depositing a layer of amorphous silicon containing doping elements on the layer made of a dielectric material 11, 21 of one of the bottom or top substrates, Depositing a layer made of a dielectric material on the amorphous silicon layer containing doping elements, Crystallising the amorphous silicon layer containing doping elements to transform it into a doped polycrystalline silicon layer intended to form the electrically conducting layer 15 of the structure, Treating the exposed surfaces of the layers made of a dielectric material by chemical-mechanical polishing (CMP), then Bringing said exposed surfaces into contact with one another to achieve the direct bonding of these surfaces to one another.

The formation of such a structure thus involves a bond between two dielectric layers, usually made of an oxide, and thus suffers from the same drawbacks as those mentioned hereinabove regarding structures of the semiconductor-on-insulator type. In particular, the addition of metal layers (for example copper or tungsten layers) at the bonding interface would still generate impurities in the semiconductor substrates. Moreover, the addition of polymer deposits at the bonding interface would be incompatible with the temperatures used in the manufacture of three-dimensional microelectronic devices.

One purpose of the present invention is thus to provide a method for the hydrophilic direct bonding of two substrates wherein the bonding interface is closed by means of a heat treatment carried out at a lower temperature than in existing methods.

Another purpose of the present invention is to provide a method for manufacturing a structure such as that shown in FIG. 4, wherein the bonding interface is closed by means of a heat treatment carried out at a lower temperature than in existing methods and/or wherein there is no need to carry out chemical-mechanical polishing of the surfaces to be bonded to one another.

Other purposes, features and advantages of the present invention will appear upon reading the following description and the accompanying drawings. It is understood that other advantages can be incorporated therein.

SUMMARY

In order to achieve at least one of the aforementioned objectives, according to one embodiment, the invention proposes a method for the hydrophilic direct bonding of a first substrate onto a second substrate, comprising:

Providing a first substrate having a first main surface and a second substrate having a second main surface, bringing the first substrate and the second substrate into contact with one another, respectively via the first and second main surfaces thereof, so as to form a bonding interface between two bonding surfaces, applying a heat treatment that is adapted to close said bonding interface, said method being characterised in that it comprises, prior to the step of bringing the substrates into contact with one another, forming, on the first main surface and/or on the second main surface, a bonding layer made of an amorphous semiconductor material having doping elements and a thickness of less than or equal to 50 nm, and advantageously between 3 and 20 nm, or even between 3 and 10 nm, a face of said bonding layer constituting one of the two bonding surfaces, an oxide layer being disposed less than 20 nm, and advantageously less than 10 nm, or even less than 6 nm, from the bonding interface.

Thus, the method according to the invention makes it possible to manufacture, at a low temperature, and more particularly at a temperature of less than or equal to 900° C., or even of less than or equal to 600° C., a composite structure including a buried electrically conducting layer, as in the case of the structure shown in FIG. 4 and discussed in the introduction. More particularly, the fact that the bonding layer is doped and is present at the bonding interface activates the plasticity of the bonding surface it forms and allows for the interface to be closed at a lower temperature than without doping; the presence of the oxide layer less than 20 nm from the bonding interface will allow the water present at the bonding interface to be managed, allowing the bonding interface to be closed.

When the oxide layer is located under the bonding layer, the thickness thereof is preferably less than 20 nm. Alternatively, the bonding layer can be located on only one of the first main surface or the second main surface and the oxide layer can be located on the other of the first main surface or the second main surface. In this alternative, the thickness of the bonding layer is preferably not limited to 20 nm, but can for example be between 20 and 50 nm.

Another aspect relates to a device obtained by the method described hereinabove.

BRIEF DESCRIPTION OF THE FIGURES

The aims, purposes, features and advantages of the invention will be better understood upon reading the detailed description given of one embodiment thereof, which is illustrated by means of the following accompanying drawings, in which.

Figure 1A:
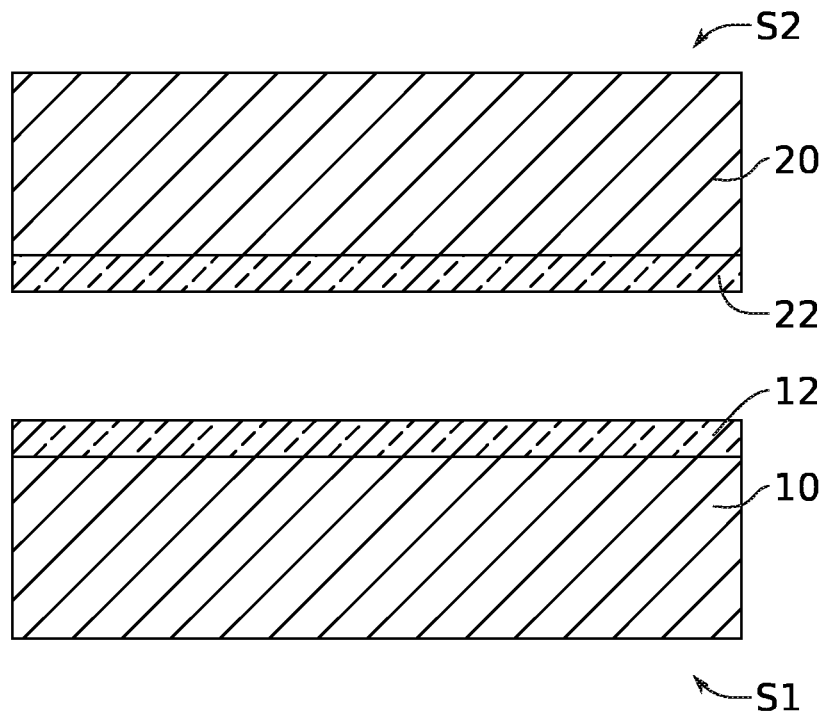
FIG. 1A diagrammatically shows a sectional view of the first and second substrates before they are brought into contact with one another according to a first embodiment of the invention.

The drawings are provided by way of example and are not intended to limit the scope of the invention. They constitute diagrammatic views intended to ease the understanding of the invention and are not necessarily to the scale of practical applications. In particular, the thicknesses and the widths of the various elements shown are not necessarily representative of reality or of realistic form factors.

DETAILED DESCRIPTION

Before giving a detailed review of embodiments of the invention, optional features are set out below, which can be used in combination with or in replacement of one another.

According to one example, the bonding layer has a thickness that is substantially comprised between 1 and 50 nm, more particularly between 3 and 10 nm.

According to one example, the heat treatment is carried out at a temperature of substantially less than or equal to 900° C., preferably substantially less than or equal to 600° C.

According to one example, the formation of the bonding layer made of an amorphous semiconductor material including doping elements comprises a step of depositing said amorphous semiconductor material on said main surface of the corresponding substrate, the doping elements being introduced into the bonding layer during or after the deposition of the amorphous semiconductor material by implantation.

According to an alternative example to the previous example, the formation of the bonding layer made of an amorphous semiconductor material including doping elements comprises:

a step of forming a so-called polycrystalline layer containing a polycrystalline semiconductor material on said main surface of the corresponding substrate, then a step of amorphising at least part of the thickness of the polycrystalline layer, from an exposed surface thereof, so as to form said bonding layer, the latter preferably having a thickness substantially comprised between 1 and 20 nm, and preferably comprised between 2 and 5 nm, the polycrystalline layer comprising the doping elements or these being introduced by implantation into the bonding layer after the amorphisation step.

According to an alternative example to the two previous examples, the formation of the bonding layer made of an amorphous semiconductor material including doping elements comprises:

a step of forming a so-called polycrystalline layer containing a doped, polycrystalline semiconductor material on said main surface of the corresponding substrate, then a step of depositing the amorphous semiconductor material on the polycrystalline layer, the doping elements being introduced into the bonding layer during or after the deposition of the amorphous semiconductor material by implantation.

According to one example, the first substrate and the second substrate each comprise a layer made of a monocrystalline semiconductor material, at least one of the first or second substrates including a layer made of a dielectric material disposed on the layer made of a monocrystalline semiconductor material, the first and/or the second main surface being formed by the free face of the layer made of a dielectric material. The oxide layer can be formed by, or comprised in, the layer made of a dielectric material.

According to one example, the content of doping elements in the bonding layer is configured, at least in terms of the nature and concentration of the doping elements, such that the crystallisation step generates an electrically conducting polycrystalline layer. The one or more doping elements are preferably selected from among phosphorus, boron, arsenic, or gallium, etc. The doping elements of the bonding layer can be introduced by ion implantation of the one or more doping elements into a layer containing a semiconductor material previously formed on said main surface of the corresponding substrate; alternatively, the doping of the bonding layer can be carried out by depositing a layer made of a semiconductor material on said main surface of the corresponding substrate in the presence of a gas or plasma comprising the one or more doping elements.

According to one example, the first substrate and the second substrate each comprise a layer made of a semiconductor material and a layer made of a dielectric material, and the bringing of the first and second substrates into contact with one another is carried out such that the layer made of a dielectric material of each substrate electrically insulates the layer made of a semiconductor material of the substrate and the bonding interface closed by the application of the heat treatment. A structure such as that shown in FIG. 4 can thus be manufactured. The layer made of a dielectric material of at least one of the first or second substrates, or of each substrate, can be formed by thermal oxidation of a thickness of the substrate. At least one of the layers made of a dielectric material of the first substrate and of the second substrate, preferably one thereof, can constitute, or comprise, the oxide layer. The layer made of a dielectric material of each substrate is preferably different to a native oxide layer of the substrate. The oxide layer is preferably different to a native oxide layer of the substrate.

According to one example, the method further comprises, between the formation of the bonding layer and the bringing of the first substrate and the second substrate into contact with one another, a treatment to render both of the bonding surfaces hydrophilic, followed by the application of water to both of said bonding surfaces to form a film of water thereon.

According to one example, the method further comprises, after bringing the first substrate and the second substrate into contact with one another, a step of thinning the first substrate so as to transfer a thin layer of the first substrate onto the second substrate.

According to one example, the method further comprises, after bringing the first substrate and the second substrate into contact with one another, a step of crystallising at least part of the thickness of the bonding layer by heat treatment. The crystallisation step can be carried out by laser annealing or by Rapid Thermal Annealing (RTA).

According to one example, the bonding layer is placed under tensile or compressive stress.

According to one example, a first bonding layer is produced on the first main surface and a second bonding layer is produced on the second main surface.

According to the previous example, the first and second bonding layers can include doping elements that differ in terms of type (N or P) and/or nature and/or concentration. Alternatively or additionally, the thickness of at least one of the first or second bonding layers is less than 10 nm, or even less than 6 nm. The oxide layer is preferably located beneath that of the first and second bonding layers that has a thickness of less than 10 nm, or even of less than 6 nm.

According to one example, direct bonding is carried out at ambient temperature and pressure.

According to one example, the bonding layer contains a material selected from: silicon and germanium.

According to one example, the method does not include any chemical-mechanical polishing step, in particular before the first substrate and the second substrate are brought into contact with one another.

A layer containing a material A is understood to mean a layer that comprises this material A and optionally other materials.

A parameter that is "substantially equal to/greater than/less than" a given value is understood to mean that this parameter is equal to/greater than/less than the given value, to within more or less 20%, or even to within 10% of this value. A parameter that is "substantially comprised between" two given values is understood to mean that this parameter is at least equal to the lowest value given, to within more or less 20%, or even 10%, of this value, and at most equal to the highest value given, to within more or less 20%, or even 10%, of this value.

Some parts, for example that take the form of a layer, can have an electrical function. Some are used for their electrically conducting properties and electrically conducting or equivalent terms are understood to mean elements made of at least one material with sufficient conductivity, in the application, to carry out the desired function. Other parts, on the other hand, are used for their electrically insulating properties and have sufficient resistivity to achieve this insulation; they are in particular referred to as dielectric or electrically insulating. Typically, an electrically conducting layer will have a resistivity at 300° K of less than 10 mΩ·cm, or even less than 100 mΩ·cm.

The doping ranges, expressed in volume concentration, preferably associated with the different types of doping indicated in the present application are as follows:

p++ or n++ doping: greater than $1 \times 10^{20}$ cm$^{-3}$
p+ or n+ doping: $1 \times 10^{18}$ cm$^{-3}$ to $9 \times 10^{19}$ cm$^{-3}$
p or n doping: $1 \times 10^{17}$ cm$^{-3}$ to $1 \times 10^{18}$ cm$^{-3}$.

Intrinsic doping is associated with the following doping range: $1 \cdot 10^{15}$ cm$^{-3}$ to $1 \cdot 10^{17}$ cm$^{-3}$.

The example embodiments described hereinbelow indicate an "N-type or P-type" doping. An N-type doping comprises an n, n+ or n++ doping, and a P-type doping comprises a p, p+ or p++ doping. In this document, the term "doping" is used to indifferently designate either N-type or P-type doping.

For a group IV semiconductor material such as diamond, silicon, germanium, silicon carbide and silicon-germanium, the most common doping elements are group III acceptors or group V element donors. For example, for a material containing silicon, mention can be made of phosphorus, arsenic, antimony, bismuth and lithium as donors for N-type doping and mention can be made of boron, aluminium, gallium and indium as acceptors for P-type doping.

Figure 1B:
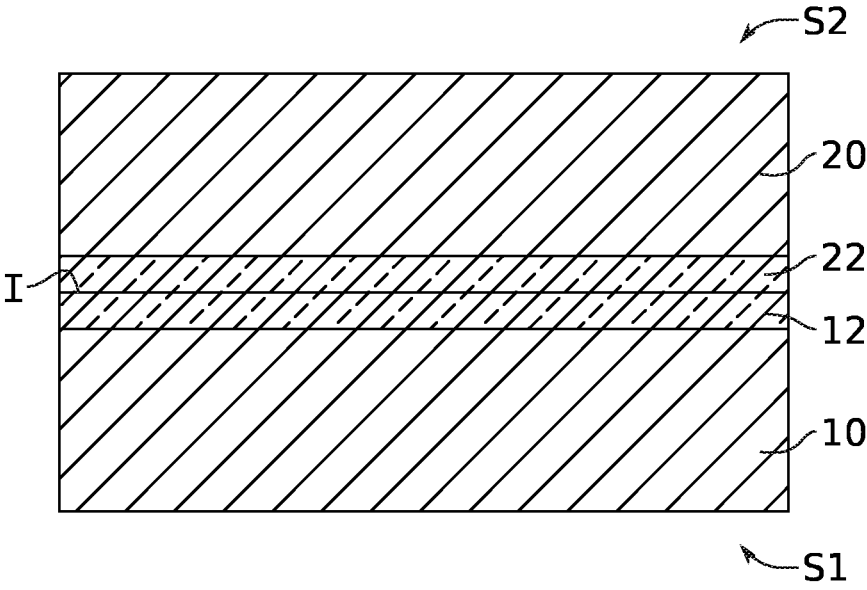
FIG. 1B diagrammatically shows a sectional view of the first and second substrates after applying the heat treatment to close the bonding interface according to the first embodiment of the invention.
Figure 1C:
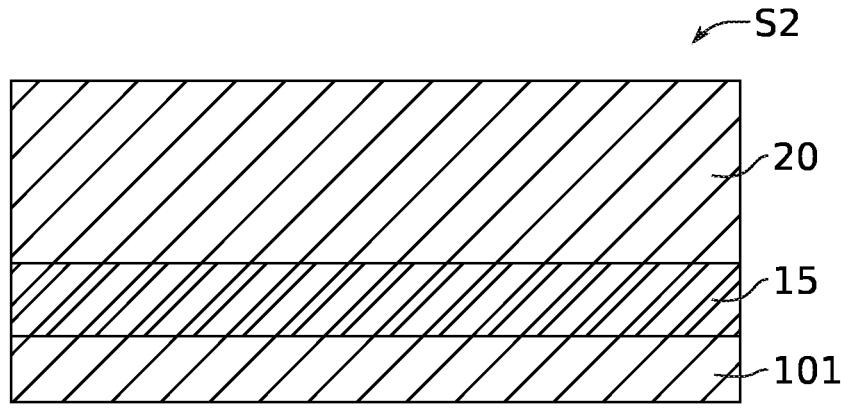
FIG. 1C diagrammatically shows a sectional view of the assembly in FIG. 1B, with the first substrate having been thinned and the bonding layers having been crystallised.

FIG. 1A to 1C show the successive steps in a method according to a first embodiment of the invention.

With reference to FIG. 1A, a first substrate S1 and a second substrate S2 are provided in order to be bonded along one of the main faces thereof.

According to one embodiment, the first substrate S1 and the second substrate S2 are semiconductor substrates, i.e. comprising at least one layer containing a semiconductor material 10, 20, such as silicon, germanium, silicon-germanium or silicon carbide for example. Advantageously, it is a monocrystalline semiconductor material. At least one of the first substrate S1 or the second substrate S2 can comprise an oxide layer intended to be disposed less than 20 nm, and advantageously less than 10 nm, or even less than 6 nm, from a bonding interface I between the substrates.

As will be clearly seen from the other embodiments described hereinbelow, at least one or each of the substrates S1 and S2 can optionally comprise other materials. In particular, at least one or each of the substrates S1 and S2 comprises a layer made of an electrically insulating material, such as the oxide of the semiconductor material of the layer 10, 20. The oxide layer can be formed by, or comprised in, a layer made of an electrically insulating material.

In general, the invention applies to any substrate that is compatible with hydrophilic direct bonding. Some substrates are naturally hydrophilic; those that are not can be treated to make at least the bonding surface thereof hydrophilic, as described hereinbelow.

Before the substrates S1 and S2 are brought into contact with one another, a bonding layer 12, 22 made of an amorphous semiconductor material including doping elements is formed, preferably at a low temperature (for example between 200° C. and 600° C.), on the main face of at least one of the two substrates, the free surface of the former forming one of the bonding surfaces.

In the example shown in FIG. 1A, a bonding layer 12 is deposited on a main face of the first substrate S1 and a bonding layer 22 is deposited on a main face of the second substrate S2. These two layers can be made of different semiconductor materials, and/or have different thicknesses or comprise different doping elements, differing in type (N or P) and/or nature and/or concentration. Alternatively, however, a single bonding layer made of an amorphous semiconductor material containing doping elements 12, 22 could be deposited on either one of the two substrates S1 and S2. In such a case, the facing bonding surface can be a monocrystalline semiconductor surface, or the surface of a dielectric layer (advantageously an oxide of the underlying semiconductor, and in particular a thermal oxide) or the surface of a layer made of an amorphous semiconductor material containing no doping element.

The bonding layer 12, 22 made of an amorphous semiconductor material including doping elements can be obtained by different techniques. An amorphous layer can be deposited, in particular by CVD (chemical vapour deposition), PECVD (plasma-enhanced CVD), LPCVD (low-pressure CVD), PVD (physical vapour deposition), ALD (atomic layer deposition), IBS (ion beam sputtering), MBE (molecular beam epitaxy) or EBE (electron beam epitaxy). A crystalline or polycrystalline layer can also be deposited, then amorphised, for example by implantation. In order for the amorphous semiconductor material of the bonding layer 12, 22 to comprise doping elements, the following species can in particular be implanted therein: Si, Ge, As, P with doses ranging from 5e14 to 1e16; the implant dose, energy and number will be chosen so as to obtain the desired amorphous layer thickness.

The addition of the doping elements to the bonding layer 12, 22 made of an amorphous semiconductor material can be carried out during the deposition of said layer or after the deposition thereof by ion implantation.

Advantageously, this can be a layer of amorphous silicon or amorphous germanium or amorphous silicon-germanium, which may or may not contain other species and in particular hydrogen or carbon.

This layer can optionally be placed under tensile or compressive stress, for example with a stress comprised between 100 and 2,000 MPa, which can facilitate the flow of this layer during the heat treatment to close the bonding interface. This stress can be achieved by implantation or during the deposition as a result of the deposition conditions used. For example, reference can be made to the article by Johlin et al. entitled "Stress engineering in amorphous silicon thin films", published in 2011 in the 37th edition of the 'IEEE Photovoltaic Specialists Conference', to adapt the stress of an amorphous silicon layer deposited by PECVD.

The thickness of each bonding layer 12, 22 can be less than or equal to 50 nm. For example, it will be substantially comprised between 1 and 50 nm, preferably between 3 and 20 nm, or even between 3 and 10 nm. The thickness of the two bonding layers 12 and 22 can be different. If a single bonding layer is used (on S1 or S2), the thickness thereof can be up to 100 nm, but will advantageously be less than 50 nm, or less than 20 nm. If two bonding layers are used and one is thick (typically more than 20 or 50 nm thick), the other will advantageously be less than 10 nm or less than 6 nm thick. The thickness of the bonding layer or of each bonding layer must preferably be assessed in relation to the relative position of the oxide layer. More particularly, the fact that the oxide layer is disposed less than 20 nm, and advantageously less than 10 nm, or even less than 6 nm from the bonding interface can impose the thickness of at least one bonding layer 12, 22.

According to one advantageous embodiment, in particular when the materials present on the main face of the substrates S1, S2 are silicon or silicon oxide, the material of the bonding layer 12, 22 is amorphous silicon or amorphous germanium or amorphous silicon-germanium.

A bonding layer 12, 22 containing amorphous silicon can be deposited as follows.

The surface of the substrate that is intended to receive the amorphous silicon layer is cleaned using an oxidising solution, for example of the type O3/HF/O3 or O3/HF/SC1. The substrate is placed in an epitaxy chamber heated to a relatively low temperature in the presence of a precursor such as disilane (Si2H6). The deposition temperature can be comprised between 475 and 550° C. The growth rate can be 5 to 10 nm/min. According to another embodiment, the precursor used is silane (SiH4), in which case the growth rate can be lower. According to other embodiments, the precursor is a liquid precursor of the formula $Si_nH_{2n+2}$, where n is an integer greater than 2, requiring the use of a bubbler; the deposition temperature can be in the order of 425 to 450° C. Lower deposition temperatures (comprised between 100 and 400° C.) can also be considered. Reference can be made to the article by Christou et al. entitled "Solid phase epitaxial regrowth of amorphous silicon on molecular beam epitaxial silicon/Si layers" published in 1983 in 'Appl. Phys. Lett. 42, 1021'.

FIG. 1B shows the bringing of the substrates S1 and S2 into contact with one another via the bonding layers 12 and 22. Hydrophilic direct bonding then takes place. It is advantageously carried out at ambient temperature or pressure.

Hydrophilic direct bonding is generally less restrictive in terms of implementation than hydrophobic direct bonding. However, such hydrophilic direct bonding generally requires the use of a hydrophilic treatment on at least the faces intended to be brought into contact with one another. Such a hydrophilic treatment can comprise SC1-type cleaning and then rinsing with water. At the end of this treatment, each of the surfaces intended to be brought into contact with one another is coated with a thin film of water (in the order of 2 or 3 monolayers thick).

For hydrophilic direct bonding to take place, the surfaces that come into contact with one another must be sufficiently smooth. If necessary, chemical-mechanical polishing (CMP) can be carried out before bonding. Advantageously, such polishing will not be necessary if the one or more amorphous layers containing doping elements is (are) deposited on a sufficiently smooth substrate S1 (and/or S2), or if the bonding takes place on a silicon oxide surface resulting from the thermal oxidation of the monocrystalline substrate S1 (or S2) that is sufficiently smooth. Said oxide surface can constitute a surface of the oxide layer.

Although smooth, the surfaces intended to be bonded to one another have asperities at which contact between the substrates S1 and S2 occurs. Cavities extend between these asperities, such that the interface I is not closed by simply bringing the substrates S1 and S2 into contact with one another.

FIG. 1B shows the structure obtained after the heat treatment to close the bonding interface I.

The heat treatment can last for example between 30 minutes and 10 hours depending on the annealing temperature and the layers present at the bonding interface. For example, the annealing temperature can be lower in the presence of amorphous germanium at the interface than in the presence of amorphous silicon at the interface.

The temperature of the heat treatment and the rate of the temperature rise can be defined by a person skilled in the art, for example from tests conducted on the closure of the interface I of a plurality of identical structures treated with different heat treatments. These tests can, for example, be based on measurements of resistance to etching at the bonding interface. For applications requiring a low thermal budget, the lowest of the temperatures that lead to complete closure of the bonding interface I will preferably be selected.

According to one example, the heat treatment is carried out at a temperature of substantially less than or equal to 900° C., preferably less than or equal to 600° C.

This heat treatment can allow the layers present at the bonding interface to flow, and at least, due to the atomic mobility at the bonding interface, allow the cavities present at this interface to disappear and thus allow the bonding interface to be completely closed. As the bonding is hydrophilic, a chemical reaction also takes place between the water and the semiconductor material present at the bonding interface I during this heat treatment. This reaction leads to the release of dihydrogen.

In the case of a hydrophilic oxide/silicon bond, the chemical reaction is written as follows:

$$2H_2O + Si \rightarrow SiO_2 + 2\,H_2$$

In other words, the water present at the bonding interface I passes through the native oxide present on the silicon (this native oxide being different from the oxide layer) and oxidises said silicon. This phenomenon occurs at 150° C. and leads to the release of hydrogen, which diffuses into the oxide layer located, where relevant, on the other side of the bonding interface. If said oxide layer is too thin or if there is a diffusion barrier between the bonding interface and the oxide layer, the dihydrogen can reopen the bonding interface by forming bubbles. To prevent this, the oxide layer will preferably be disposed less than 20 nm (and advantageously less than 10 nm, or even less than 6 nm) from the bonding interface. Reference can be made in this respect to the publication by S. Vincent et al. entitled "A model of interface defect formation in silicon wafer bonding" published in the journal Applied Physics Letters (94, 101914 (2009)).

It was therefore feared that the amorphous bonding layer would form such a barrier and lead to significant defectiveness in the bonded structure.

Surprisingly, however, such defectiveness is not generated for a structure bonded with one or more amorphous bonding layers containing doping elements 12 and 22 as described hereinabove. The one or more bonding layers 12 and 22 as described hereinabove can thus be considered, in particular, to be sufficiently thin or permeable to dihydrogen to allow the dihydrogen to be diffused into the buried oxide layer, thus ensuring a high-quality bond.

It should be noted that only one of the two bonding layers 12 and 22 is considered to comprise doping elements; in this case:

the concentration of the one or more doping elements in the bonding layer can be increased in relation to the case where both of the bonding layers 12 and 22 comprise doping elements and/or the thickness of the bonding layer not comprising a doping element can be reduced, for example to between 1 and 6 nm, so as to ensure diffusion of the dihydrogen as discussed hereinabove.

Following the step of bringing the substrates into contact with one another and during the heat treatment step, each bonding layer 12, 22 containing an amorphous semiconductor material can be converted, over part of the thickness thereof, into an oxide of this material by reaction with the bonding water at the surface thereof, forming at least in part the bonding interface I.

Where a single bonding layer 12 is provided on the first substrate S1, the part of the bonding layer converted to an oxide can be combined with a native oxide layer of the second substrate S2 to form an oxide layer. This partly native oxide layer is preferably different from, or even extended by, the oxide layer disposed less than 20 nm (and advantageously less than 10 nm, or even less than 6 nm) from the bonding interface.

According to an alternative embodiment, this phenomenon is prevented from transforming the entire thickness of the one or more bonding layers 12, 22 containing an amorphous semiconductor material into its oxide during the heat treatment to close the bonding interface I. For this purpose, the thickness of the bonding layer 12, 22 containing an amorphous semiconductor material can be chosen such that it is high enough that the reaction with the bonding water does not completely consume it. For this purpose, each bonding layer preferably has a minimum thickness substantially greater than or equal to 4 nm. Thus, each bonding layer preferably has a thickness substantially comprised between 5 nm and 20 to 50 nm.

As shown in FIG. 1B, following the application of the heat treatment to close the bonding interface I, the assembly obtained successively comprises:

The first substrate S1,

The bonding layers containing an amorphous semiconductor material containing doping elements, and The second substrate S2, At least one of the first substrate S1 or the second substrate S2 comprising the oxide layer disposed less than 20 nm, and advantageously less than 10 nm, or even less than 6 nm, from the bonding interface.

At the bonding interface I, the assembly can further comprise (in a manner not shown in FIG. 1B) at least one thin oxide layer of the amorphous semiconductor material present at this bonding interface I, this thin oxide layer having been generated by reaction with the bonding water as described hereinabove.

FIG. 1C shows the structure obtained, at the end of a step of crystallising the bonding layers containing an amorphous semiconductor material containing doping elements 12, 22 present at the bonding interface I and a step of thinning the first substrate S1, which are described hereinbelow.

This crystallisation can be achieved directly during the heat treatment to close the bonding interface if the temperature of this treatment is sufficiently high or can require additional heat treatment. This will be accompanied by an activation of the doping elements present to form a layer containing a doped, polycrystalline semiconductor material constituting a conductive layer 15 within the assembled structure.

For applications requiring a limited thermal budget, the step of crystallising (and/or of activating the one or more doping elements) the bonding layers containing an amorphous semiconductor material containing doping elements 12, 22 can be carried out by at least laser annealing or by any other technique with an even lower thermal budget. Alternatively (in particular for applications without any particular thermal budget limitations) or additionally, the crystallisation step can involve rapid thermal annealing (commonly referred to as RTA) or flash annealing.

More particularly, the crystallisation in polycrystalline form of the amorphous bonding layers can be carried out, or at least initiated, by means of laser annealing, which typically induces crystallisation according to a so-called explosive crystallisation process. For this purpose, the exposed main surface of the first substrate S1 and/or of the second substrate S2 can be subjected to laser irradiation, preferably pulsed irradiation, typically irradiation with a duration of less than one microsecond, for example 200 nanoseconds, which initiates crystallisation. If necessary, this laser annealing can be followed by a further heat treatment and/or one or more further laser annealing operations to promote the development of the polycrystalline microstructure generated by the initial laser annealing operation. The additional heat treatment can typically last from 10 minutes at 500° C. to 2$s$ at 1,100° C. Additional laser annealing operations (up to 100 annealing operations as required) are carried out in such a way as not to allow the materials involved to melt.

Crystallisation can take place as shown in FIG. 1C over the entire thickness of the amorphous bonding layers 12 and 22 or only over part of the thickness of these layers.

The step of thinning the first substrate S1 is carried out via the face of the first substrate S1 that is opposite the bonding interface I. This thinning step can involve at least one thinning method, such as the Smart Cut™ method, the method known by the acronym BESOI for "Bond and Etch-back Silicon On Insulator", or etching. It can be carried out before or after the heat treatment to close the interface.

Preferably, and in particular when the crystallisation step involves laser annealing via the face of the first substrate S1 that is opposite the bonding interface I, the thinning step is carried out before the crystallisation step.

It should be noted that crystallisation can only take place in one or more localised areas of the bonding layer, with one or more other areas not being subjected to such a transformation. The recrystallisation laser annealing operation can be carried out through a mask. The regions that have become polycrystalline are thus obtained in the area irradiated by the laser in line with the openings in the mask. The amorphous regions not irradiated by the laser can remain amorphous or be made monocrystalline by a suitable treatment, for example by solid phase recrystallisation annealing referred to as SPER if this amorphous layer is in contact with a monocrystalline semiconductor.

As shown in FIG. 1C, following the crystallisation step and the step of thinning the first substrate S1, the assembly obtained can successively comprise:

A thin layer 101 derived from the first substrate S1,

A layer containing a doped, polycrystalline semiconductor material 15, and

The second substrate S2,

At least one of the thin layer 101 or the second substrate S2 comprising, where relevant, the oxide layer disposed less than 20 nm, and advantageously less than 10 nm, or even less than 6 nm, from the bonding interface.

Thus, a thin layer 101 of the first substrate has been transferred onto the second substrate S2.

Figure 2A:
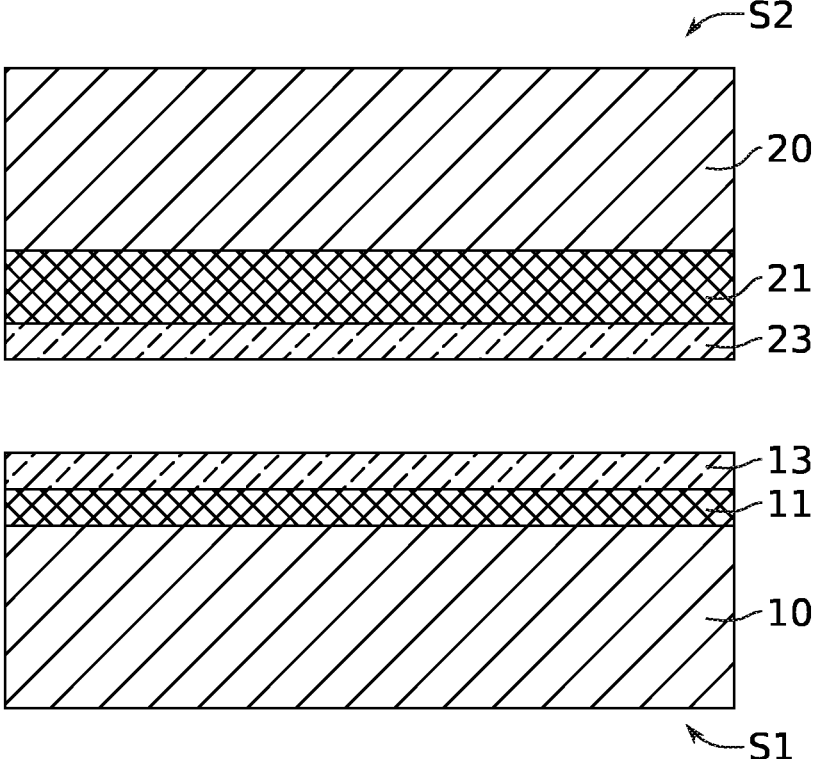
FIG. 2A diagrammatically shows a sectional view of the first and second substrates before they are brought into contact with one another according to a second embodiment of the invention.
Figure 2B:
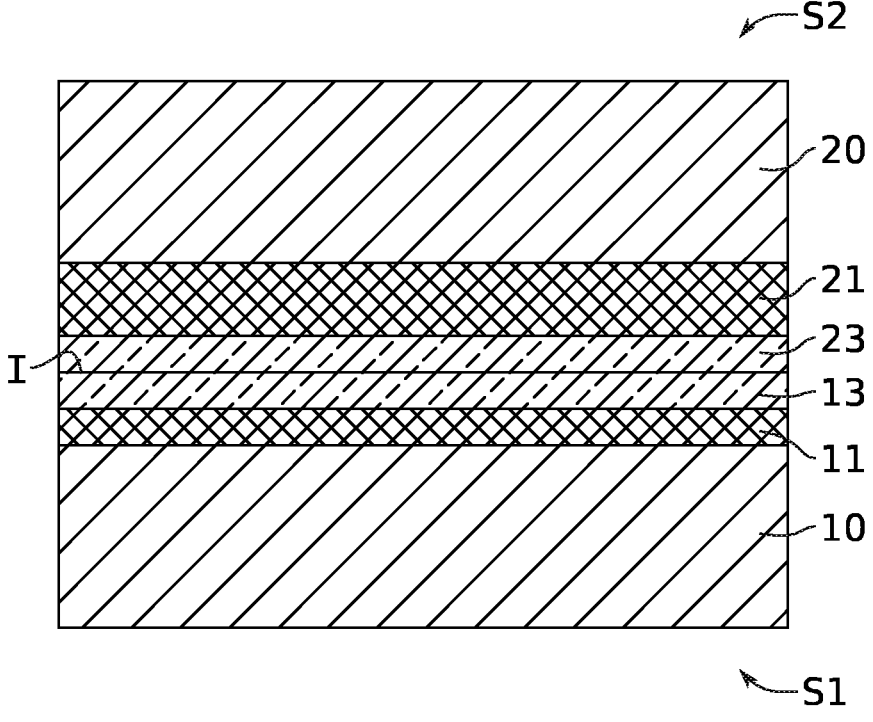
FIG. 2B diagrammatically shows a sectional view of the first and second substrates after applying the heat treatment to close the bonding interface according to the second embodiment of the invention.
Figure 2C:
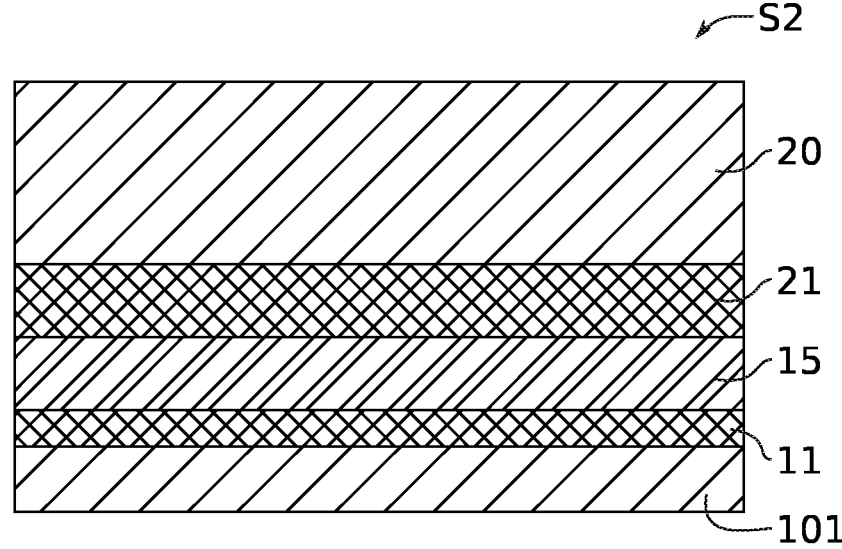
FIG. 2C diagrammatically shows a sectional view of the assembly in FIG. 2B, with the first substrate having been thinned and the bonding layers having been crystallised.

FIG. 2A to 2C show the successive steps in a method according to a second embodiment of the invention. The paragraphs below more particularly describe the features of the method according to the second embodiment of the invention that distinguish it from the method described with reference to FIG. 1A to 1C.

As shown in FIG. 2A, the first substrate S1 and the second substrate S2 as provided each comprise a layer containing a semiconductor material 10, 20, that is advantageously monocrystalline, a layer containing a dielectric material 11, 21, typically containing the oxide of the semiconductor material of the layer 10, 20, and at least one of the first substrate S1 or the second substrate S2 as provided comprises an oxide layer disposed less than 20 nm, and advantageously less than 10 nm, or even less than 6 nm, from the bonding interface. Where appropriate, the oxide layer can be formed by, or comprised in, the layer made of a dielectric material 11, 21.

As for the first embodiment of the invention, in addition to silicon, other semiconductor materials such as germanium, silicon-germanium or silicon carbide can be considered.

Each dielectric layer 11, 21 is preferably formed by thermal oxidation of the semiconductor material constituting the corresponding substrate. Alternatively, each dielectric layer 11, 21 can have been deposited on one of the main faces of the corresponding substrate, for example by PECVD or ALD.

It should be remembered that a thermal oxide layer differs from a native oxide layer in the thickness thereof (the native oxide layer being much thinner than the thermal oxide layer). The native oxide layer is naturally present at the surface of a substrate, and is not necessarily intended to carry out an electrical insulation function within the structure obtained by bonding the two substrates, unlike a thermal oxide layer as considered here.

Alternatively, each dielectric layer 11, 21 can contain silicon nitride. In these cases, it can be deposited in particular by PECVD, LPCVD or ALD.

The subsequent steps of bringing the substrates into contact with one another and applying the heat treatment to close the bonding interface I can thus be carried out as described hereinabove with reference to the first embodiment of the invention, a bonding layer 13, 23 made of an amorphous semiconductor material including doping elements being provided on at least one of the substrates S1 or S2 at the face thereof intended to be assembled. The step of bringing the substrates into contact with one another thus produces the structure shown in FIG. 2B. The step of bringing the substrates into contact with one another can also be followed, simultaneously with or subsequently to the application of the heat treatment to close the interface, by the crystallisation step and optionally the thinning step in the manner described hereinabove with reference to the first embodiment of the invention to produce a structure as shown in FIG. 2C.

As shown in FIG. 2C, if crystallisation takes place over the entire thickness of the bonding layers 13, 23, and following the step of thinning the first substrate S1 and of activating the dopants, the assembly obtained can successively comprise:

A thin layer 101 derived from the first substrate S1,

A dielectric layer 11,

A layer containing a doped, polycrystalline semiconductor material 15,

A dielectric layer 21, and

The second substrate S2,

At least one of the thin layer 101 or the second substrate S2 comprising, where relevant, the oxide layer disposed less than 20 nm, and advantageously less than 10 nm, or even less than 6 nm, from the bonding interface.

The layer containing a doped, polycrystalline semiconductor material 15 thus forms a conductive layer buried in the structure and is capable of being biased and electrically insulated from the thin layer 101 and from the second substrate S2 by the dielectric layers 11 and 21 respectively.

At the bonding interface I, the assembly can further comprise (in a manner not shown in FIG. 2C) at least one thin oxide layer of the amorphous semiconductor material present at this bonding interface I, as explained hereinabove. This thin oxide layer is different from the oxide layer disposed less than 20 nm, and advantageously less than 10 nm, or even less than 6 nm, from the bonding interface; however, the thin oxide layer can be extended by the oxide layer disposed less than 20 nm, and advantageously less than 10 nm, or even less than 6 nm, from the bonding interface.

If crystallisation is only over part of the thickness of the bonding layers 13, 23, amorphous layers will remain within the structure.

Figure 4:
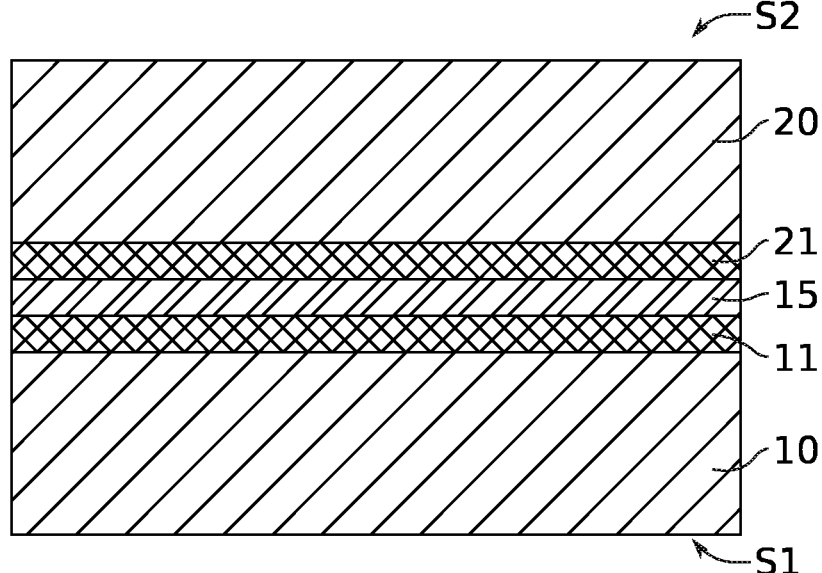
FIG. 4 diagrammatically shows a sectional view of an example structure from which a three-dimensional microelectronic device can be formed.

The structure shown in FIG. 2C is seen to be similar to that shown in FIG. 4. The method according to the second embodiment of the invention thus produces a structure that is adapted to the monolithic 3D integration of microelectronic components.

FIG. 3A to 3D show the successive steps in a method according to a third embodiment of the invention. The paragraphs below more specifically describe the features of the method according to the third embodiment of the invention that distinguish it from the method described with reference to FIG. 2A to 2C.

The third embodiment of the invention essentially differs from the second embodiment of the invention described hereinabove in that a so-called polycrystalline layer 14 containing a polycrystalline semiconductor material having an N-type or P-type doping is formed on the main surface of the first substrate S1 (alternatively or additionally it could be formed on the second substrate S2). The doped polycrystalline layer 14 preferably has a thickness that is substantially comprised between 1 and 50 nm, preferably between 3 and 20 nm, or even between 3 and 10 nm.

The doped polycrystalline layer 14 can be formed by deposition, for example by PVD, CVD or ALD. It can alternatively be formed by depositing an amorphous layer of said semiconductor material, then by crystallising this amorphous layer, for example by laser annealing or any other annealing operation described hereinabove. This crystallisation of the amorphous layer from which the polycrystalline layer 14 is formed can also be carried out after the formation of an amorphous layer 12, 13 as described hereinbelow. The crystallisation of said amorphous layer can more particularly be carried out during the step of crystallising this amorphous layer 12, 13.

Figure 3A:
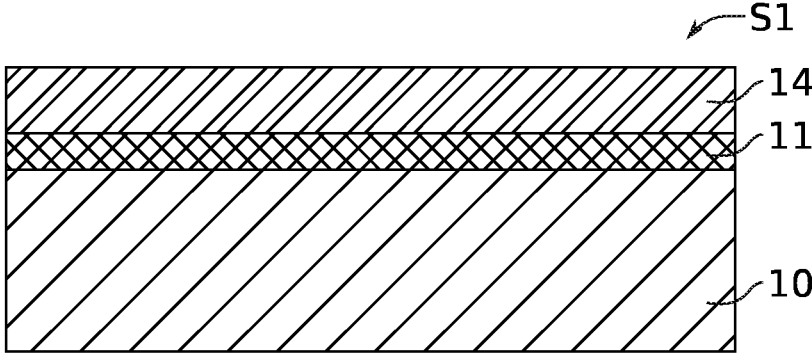
FIG. 3A to 3D diagrammatically show sectional views successively illustrating an alternative embodiment of the method according to the second embodiment thereof.
Figure 3B:
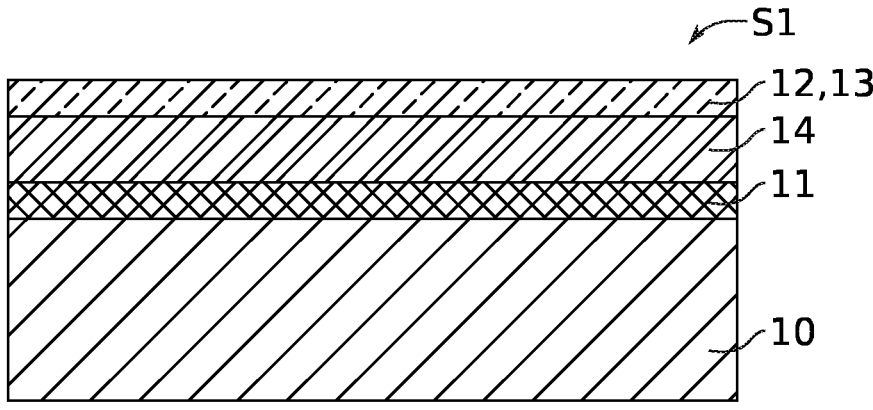

The amorphous layer 12, 13 as shown in FIG. 3B can be produced by a step of amorphising part of the thickness of the polycrystalline layer 14, in particular when the latter contains polycrystalline silicon. The amorphisation step is preferably carried out from an exposed surface of the polycrystalline layer 14, for example by ion implantation. The amorphous layer 12, 13 preferably has a thickness substantially comprised between 1 and 5 nm.

Alternatively, the amorphous layer 12, 13 as shown in FIG. 3B can be deposited on the exposed face of the polycrystalline layer 14, for example in the manner discussed hereinabove with reference to the deposition of the bonding layer 12 according to the first embodiment of the invention.

Figure 3C:
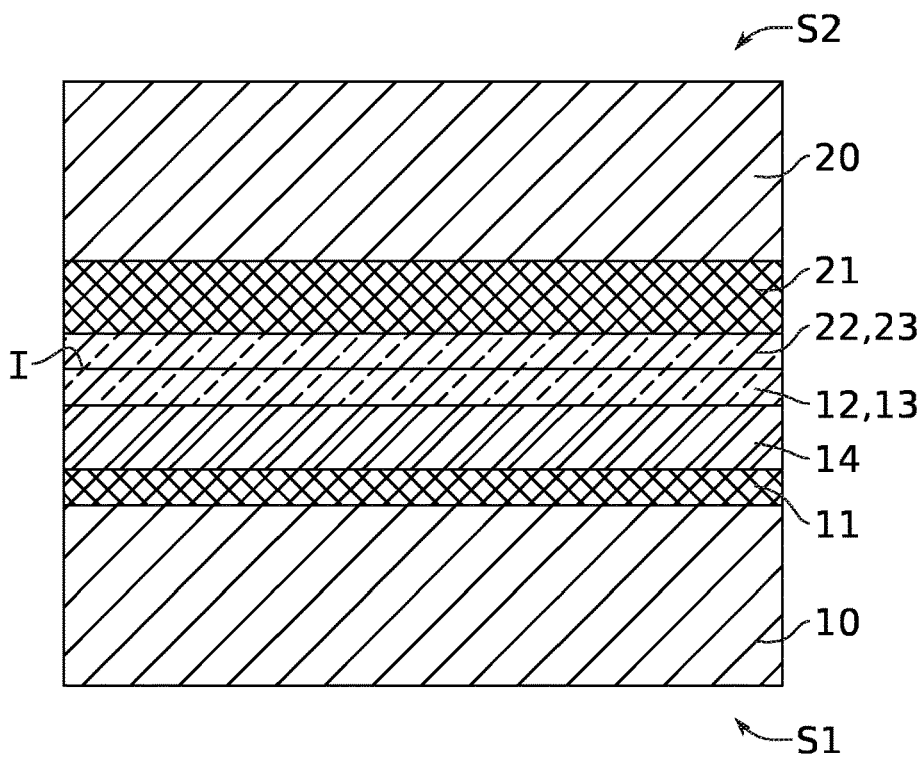

The second substrate S2 provided can be identical to S1 or identical to the second substrate S2 described hereinabove with reference to the second embodiment of the invention. The step of bringing the substrates into contact with one another leads, in the latter case, to a configuration as shown in FIG. 3C, whereas the application of the heat treatment to close the bonding interface I and the crystallisation step lead to a structure as shown in FIG. 3D.

Figure 3D:
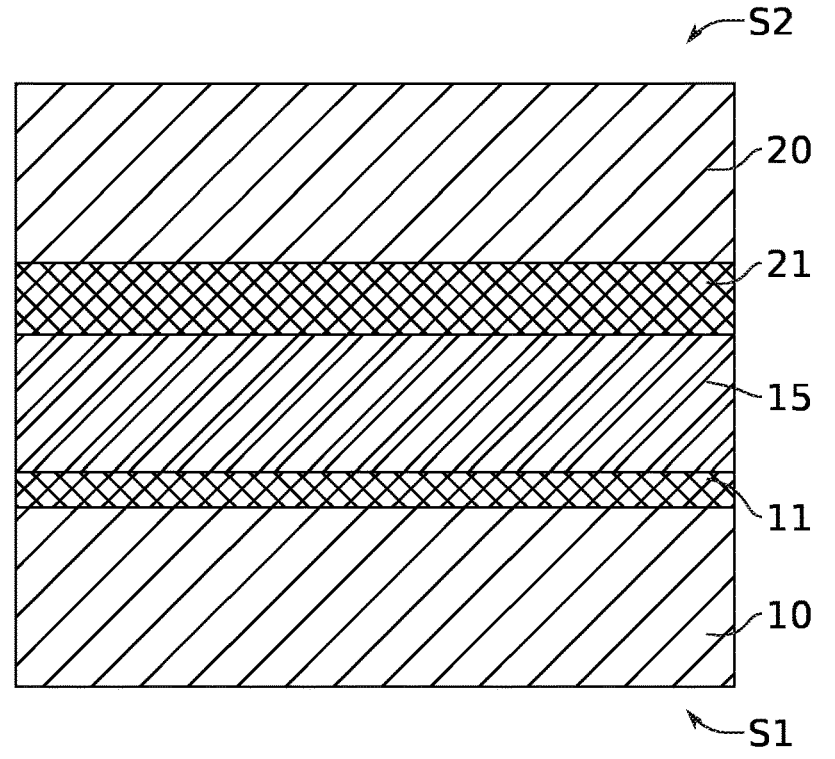

As shown in FIG. 3D, if crystallisation is carried out over the entire thickness of the bonding layers 13, 23, the assembly obtained can successively comprise:

The first substrate S1,

A dielectric layer 11,

A layer containing a doped, polycrystalline semiconductor material 15,

A dielectric layer 21, and

The second substrate S2

At least one of the first substrate S1 or the second substrate S2 comprising the oxide layer disposed less than 20 nm, and advantageously less than 10 nm, or even less than 6 nm, from the bonding interface.

The layer containing a doped, polycrystalline semiconductor material 15 forming a conductive layer buried within the stack is, in this case, derived from the bonding layers 12, 13 and 22, 23 and from the polycrystalline layer 14.

At the bonding interface I, the assembly can further comprise (in a manner not shown in FIG. 3D) at least one thin oxide layer of the amorphous semiconductor material as explained hereinabove. This thin oxide layer is different from the oxide layer disposed less than 20 nm, and advantageously less than 10 nm, or even less than 6 nm, from the bonding interface; however, the thin oxide layer can be extended by the oxide layer disposed less than 20 nm, and advantageously less than 10 nm, or even less than 6 nm, from the bonding interface.

A step of thinning the first substrate S1 can also be implemented as described hereinabove with reference to the first embodiment of the invention.

Like the structure shown in FIG. 2C, by implementing the method according to the third embodiment of the invention, a structure as shown in FIG. 3D is obtained, which is adapted to the monolithic 3D integration of microelectronic components.

It should be noted that, insofar as the polycrystalline layer 14 has already been formed before the crystallisation step of the bonding layers 12, 13 and 22, 23, this crystallisation step is not necessary in order to obtain a structure adapted to the monolithic 3D integration of microelectronic components, since the polycrystalline layer 14 can alone constitute the electrically conducting layer 15.

The invention is not limited to the aforementioned embodiments, and includes all embodiments compliant with the general concept thereof.

The invention claimed is:

1. A method for hydrophilic direct bonding of a first substrate onto a second substrate, the method comprising:

providing the first substrate having a first main surface and the second substrate having a second main surface;

bringing the first substrate and the second substrate into contact with one another, respectively, via the first and the second main surfaces thereof, so as to form a bonding interface between two bonding surfaces;

applying a heat treatment configured to close the bonding interface; and prior to the step of bringing the first and the second substrates into contact with one another, forming, on the first main surface and/or on the second main surface, a bonding layer made of an amorphous semiconductor material having one of N-type and P-type doping elements and a thickness of less than or equal to 50 nm, a face of the bonding layer constituting one of the two bonding surfaces, an oxide layer being disposed less than 20 nm from the bonding interface.

2. The method according to claim 1, wherein the heat treatment is carried out at a temperature of substantially less than or equal to 900° C.

3. The method according to claim 1, wherein the heat treatment is carried out at a temperature of substantially less than or equal to 600° C.

4. The method according to claim 1, wherein the forming of the bonding layer made of the amorphous semiconductor material including doping elements comprises a step of depositing the amorphous semiconductor material on the main surface of the corresponding substrate, the doping elements being introduced into the bonding layer during or after the deposition of the amorphous semiconductor material by implantation.

5. The method according to claim 1, wherein the first substrate and the second substrate each comprise a layer made of a monocrystalline semiconductor material, at least one of the first substrate or the second substrate including a layer made of a dielectric material disposed on the layer made of the monocrystalline semiconductor material, the first main surface and/or the second main surface being formed by a free face of the layer made of the dielectric material.

6. The method according to claim 1, further comprising, between the forming of the bonding layer and the bringing of the first substrate and the second substrate into contact with one another, a treatment to render both of the bonding surfaces hydrophilic, followed by an application of water to both of the bonding surfaces to form a film of water thereon.

7. The method according to claim 1, further comprising, after the bringing of the first substrate and the second substrate into contact with one another, a step of thinning the first substrate so as to transfer a thin layer of the first substrate onto the second substrate.

8. The method according to claim 1, further comprising, after the bringing of the first substrate and the second substrate into contact with one another, a step of crystallizing at least part of a thickness of the bonding layer by heat treatment.

9. The method according to claim 8, wherein a content of doping elements in the bonding layer is configured, at least in terms of the nature and concentration of the doping elements, such that the step of crystallizing generates an electrically conducting polycrystalline layer.

10. The method according to claim 8, wherein the step of crystallizing is carried out by laser annealing.

11. The method according to claim 1, wherein the bonding layer is placed under tensile or compressive stress.

12. The method according to claim 1, wherein a first bonding layer is produced on the first main surface and a second bonding layer is produced on the second main surface.

13. The method according to claim 12, wherein the first and the second bonding layers include doping elements that differ in terms of being N-type or P-type and/or nature and/or concentration.

14. The method according to claim 12, wherein a thickness of at least one of the first or the second bonding layers is less than 10 nm.

15. The method according to claim 12, wherein a thickness of at least one of the first or the second bonding layers is less than 6 nm.

16. The method according to claim 13, wherein a thickness of at least one of the first or the second bonding layers is less than 10 nm.

17. The method according to claim 1, wherein the first main surface and the second main surface each comprise an oxide material.

18. A method for hydrophilic direct bonding of a first substrate onto a second substrate, the method comprising:

providing the first substrate having a first main surface and the second substrate having a second main surface;

bringing the first substrate and the second substrate into contact with one another, respectively, via the first and the second main surfaces thereof, so as to form a bonding interface between two bonding surfaces;

applying a heat treatment configured to close the bonding interface; and prior to the step of bringing the first and the second substrates into contact with one another, forming, on the first main surface and/or on the second main surface, a bonding layer made of an amorphous semiconductor material having one of N-type and P-type doping elements and a thickness of less than or equal to 50 nm, a face of the bonding layer constituting one of the two bonding surfaces, an oxide layer being disposed less than 20 nm from the bonding interface, wherein the forming of the bonding layer made of the amorphous semiconductor material including doping elements comprises:

a step of forming a polycrystalline layer containing a polycrystalline semiconductor material on the main surface of the corresponding substrate, then forming the bonding layer made of the amorphous semiconductor on an exposed surface of the polycrystalline layer.

19. The method according to claim 18, wherein the bonding layer has a thickness between about 1 nm and about 20 nm.

20. The method according to claim 18, wherein the bonding layer has a thickness between about 2 nm and about 5 nm.

21. The method according to claim 18, wherein the forming of the bonding layer made of the amorphous semiconductor material including doping elements comprises:

a step of forming a doped, polycrystalline semiconductor material on the main surface of the corresponding substrate as the polycrystalline layer, then a step of depositing the amorphous semiconductor material on the polycrystalline layer, the doping elements being introduced into the bonding layer during or after the deposition of the amorphous semiconductor material by implantation.

22. The method according to claim 18, wherein forming the bonding layer made of the amorphous semiconductor on the exposed surface of the polycrystalline layer comprises a step of amorphizing at least part of a thickness of the exposed surface of the polycrystalline layer, the doping elements or the doping elements being introduced by implantation into the bonding layer after the amorphization step.

* * * * *